(12) United States Patent
Khoo et al.

(10) Patent No.: US 9,263,419 B2
(45) Date of Patent: Feb. 16, 2016

(54) LEAD FRAME STRIPS WITH ELECTRICAL ISOLATION OF DIE PADDLES

(71) Applicant: Infineon Technologies AG, Neubiberg (DE)

(72) Inventors: Nee Wan Khoo, Melaka (MY); Lay Yeap Lim, Batu Berendam (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/015,148

(22) Filed: Aug. 30, 2013

(65) Prior Publication Data

US 2015/0064849 A1 Mar. 5, 2015

(51) Int. Cl.
| | |
|---|---|
| *H01L 21/66* | (2006.01) |
| *H01L 23/495* | (2006.01) |
| *H01L 23/00* | (2006.01) |
| *H01L 23/31* | (2006.01) |
| *H01L 21/56* | (2006.01) |

(52) U.S. Cl.
CPC .............. *H01L 24/89* (2013.01); *H01L 23/495* (2013.01); *H01L 23/49541* (2013.01); *H01L 23/49558* (2013.01); *H01L 21/561* (2013.01); *H01L 22/14* (2013.01); *H01L 23/3107* (2013.01); *H01L 2224/2919* (2013.01); *H01L 2224/32245* (2013.01); *H01L 2224/48245* (2013.01); *H01L 2224/50* (2013.01); *H01L 2224/73265* (2013.01); *H01L 2224/73269* (2013.01); *H01L 2924/181* (2013.01)

(58) Field of Classification Search
CPC ... H01L 23/49541; H01L 24/86; H01L 24/97; H01L 2224/48247; H01L 2224/50; H01L 2224/92247; H01L 2224/97
See application file for complete search history.

(56) References Cited

U.S. PATENT DOCUMENTS

| | | | |
|---|---|---|---|
| 6,229,200 B1 * | 5/2001 | Mclellan et al. | ............... 257/666 |
| 6,756,658 B1 * | 6/2004 | Gillett et al. | .................. 257/666 |
| 7,479,409 B2 | 1/2009 | Camacho et al. | |
| 8,236,612 B2 | 8/2012 | San Antonio et al. | |
| 2008/0258278 A1 | 10/2008 | Ramos et al. | |
| 2008/0265923 A1 | 10/2008 | Kitnarong et al. | |
| 2014/0327004 A1 * | 11/2014 | Baterna Marbella | ........... 257/48 |

\* cited by examiner

*Primary Examiner* — Pamela E Perkins
(74) *Attorney, Agent, or Firm* — Murphy, Bilak & Homiller, PLLC (57) ABSTRACT

A lead frame strip includes connected unit lead frames each having a die paddle, a tie bar directly connecting the die paddle to a periphery of the unit lead frame, leads directly connected to the periphery of the unit lead frame and projecting toward the die paddle, and an opening in the periphery adjacent the tie bar. The openings in the periphery of the unit lead frames are spanned with an electrically insulating material that connects the tie bar of each unit lead frame to the periphery of the unit lead frame. The direct connections between the tie bars and the periphery of the unit lead frames are severed prior to subsequent processing, so that the tie bars remain connected to the periphery of the unit lead frames by the electrically insulating material and the die paddles are electrically disconnected from the periphery of the unit lead frames.

16 Claims, 9 Drawing Sheets

Figure 4B

LEAD FRAME STRIPS WITH ELECTRICAL ISOLATION OF DIE PADDLES

TECHNICAL FIELD

The instant application relates to lead frame strips, and more particularly to electrical isolation of lead frame die paddles during lead frame processing.

BACKGROUND

A lead frame forms the base or skeleton of an IC package, providing mechanical support to semiconductor dies during assembly into a finished package. A lead frame typically includes a die paddle for attaching a semiconductor die, and leads providing the means for external electrical connection to the die. The die can be connected to the leads by wires, e.g. through wire bonding or tape automated bonds. Lead frames are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the die paddle and lead construction described above.

Semiconductor dies attached to the die paddles after completion of the assembly process of a lead frame strip are usually tested after separation of the unit lead frames from the lead frame strip, e.g. by punching. Alternatively, the unit lead frames remain mechanically connected to the lead frame strip by tie bars during die testing. This is commonly referred to as lead frame strip testing. Separation of the unit lead frames from the lead frame strip occurs after electrical testing. The die paddles remain electrically connected to the lead frame strip by the tie bars during testing. This is problematic for applications where the die paddles serve an electrical connection function, e.g. in DSO (dual small outline) packages where the exposed die paddles provide an electrical connection to the backside of semiconductor dies attached to the die paddles. In this case, the tie bars electrically short the die paddles to the lead frame strip and to other die paddles attached to the same lead frame strip, complicating the electrical testing process. Electrical isolation is also required for other lead frame processing such as partial plating and electrical charge processes.

SUMMARY

A lead frame strip includes a plurality of connected unit lead frames, each unit lead frame having a die paddle, a tie bar directly connecting the die paddle to a periphery of the unit lead frame, a plurality of leads directly connected to the periphery of the unit lead frame and projecting toward the die paddle, and an opening in the periphery adjacent the tie bar. According to an embodiment of a method of processing the lead frame strip, the method comprises: attaching a semiconductor die to each of the die paddles; spanning the openings in the periphery of the unit lead frames with an electrically insulating material that connects the tie bar of each unit lead frame to the periphery of the unit lead frame; covering the unit lead frames with a molding compound so that part of each tie bar and lead remains uncovered by the molding compound; severing the direct connection between the leads and the periphery of the unit lead frames and the direct connection between the tie bars and the periphery of the unit lead frames, so that the tie bars remain connected to the periphery of the unit lead frames by the electrically insulating material and the die paddles are electrically disconnected from the periphery of the unit lead frames; and processing the lead frame strip after the severing of the direct connections.

A lead frame strip includes a plurality of connected unit lead frames, each unit lead frame having a die paddle, a tie bar directly connecting the die paddle to a periphery of the unit lead frame, and a plurality of leads directly connected to the periphery of the unit lead frame and projecting toward the die paddle. According to an embodiment of a method of processing the lead frame strip, the method comprises: forming an opening in the periphery of each unit lead frame adjacent the tie bar of the unit lead frame; attaching a semiconductor die to each of the die paddles; spanning the openings in the periphery of the unit lead frames with an electrically insulating material that connects the tie bar of each unit lead frame to the periphery of the unit lead frame; covering the unit lead frames with a molding compound so that part of each tie bar and lead remains uncovered by the molding compound; severing the direct connection between the leads and the periphery of the unit lead frames and the direct connection between the tie bars and the periphery of the unit lead frames, so that the tie bars remain connected to the periphery of the unit lead frames by the electrically insulating material and the die paddles are electrically disconnected from the periphery of the unit lead frames; and processing the lead frame strip after the severing of the direct connections.

According to an embodiment of a lead frame strip, the lead frame strip comprises a plurality of connected unit lead frames. Each unit lead frame has a die paddle, a first tie bar directly connecting the die paddle to a periphery of the unit lead frame, a second tie bar directly connecting adjacent die paddles to one another and to the periphery of the unit lead frames including the adjacent die paddles, and a plurality of leads directly connected to the periphery of the unit lead frame and projecting toward the die paddle. The lead frame strip further comprises a first opening in the periphery of each unit lead frame adjacent the first tie bar of the unit lead frame, and a second opening in the periphery of each unit lead frame adjacent the second tie bar of the unit lead frame.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 2, which includes

FIG. 3, which includes

FIG. 4, which includes

FIG. 5, which includes

DETAILED DESCRIPTION

Embodiments described herein provide a lead frame strip comprising a plurality of connected unit lead frames. Each unit lead frame has a die paddle for attaching a semiconductor die, a tie bar connecting the die paddle to a periphery of the unit lead frame, and a plurality of leads projecting from the periphery toward the die paddle. The unit lead frames are later separated from the lead frame strip into individual units after die attach and processed e.g. by lead frame strip testing, partial plating, electrical charging, etc. The lead frame strip further includes an opening in the periphery of the unit lead frames adjacent each of the tie bars. Prior to testing of the semiconductor dies attached to the die paddles, partial plating, electrical charging, etc. the openings in the periphery of the unit lead frames are spanned with an electrically insulating material that connects the tie bar of each unit lead frame to the periphery of the unit lead frame. The openings in the periphery of the unit lead frames are designed such that the direct connection between the tie bars and the periphery of the unit lead frames can be severed and the severed tie bars remain connected to the periphery of the unit lead frames by the electrically insulating material. This way, the die paddles are electrically disconnected from the periphery of the unit lead frames during lead frame strip testing, partial plating, electrical charging, etc.

Figure 1A:
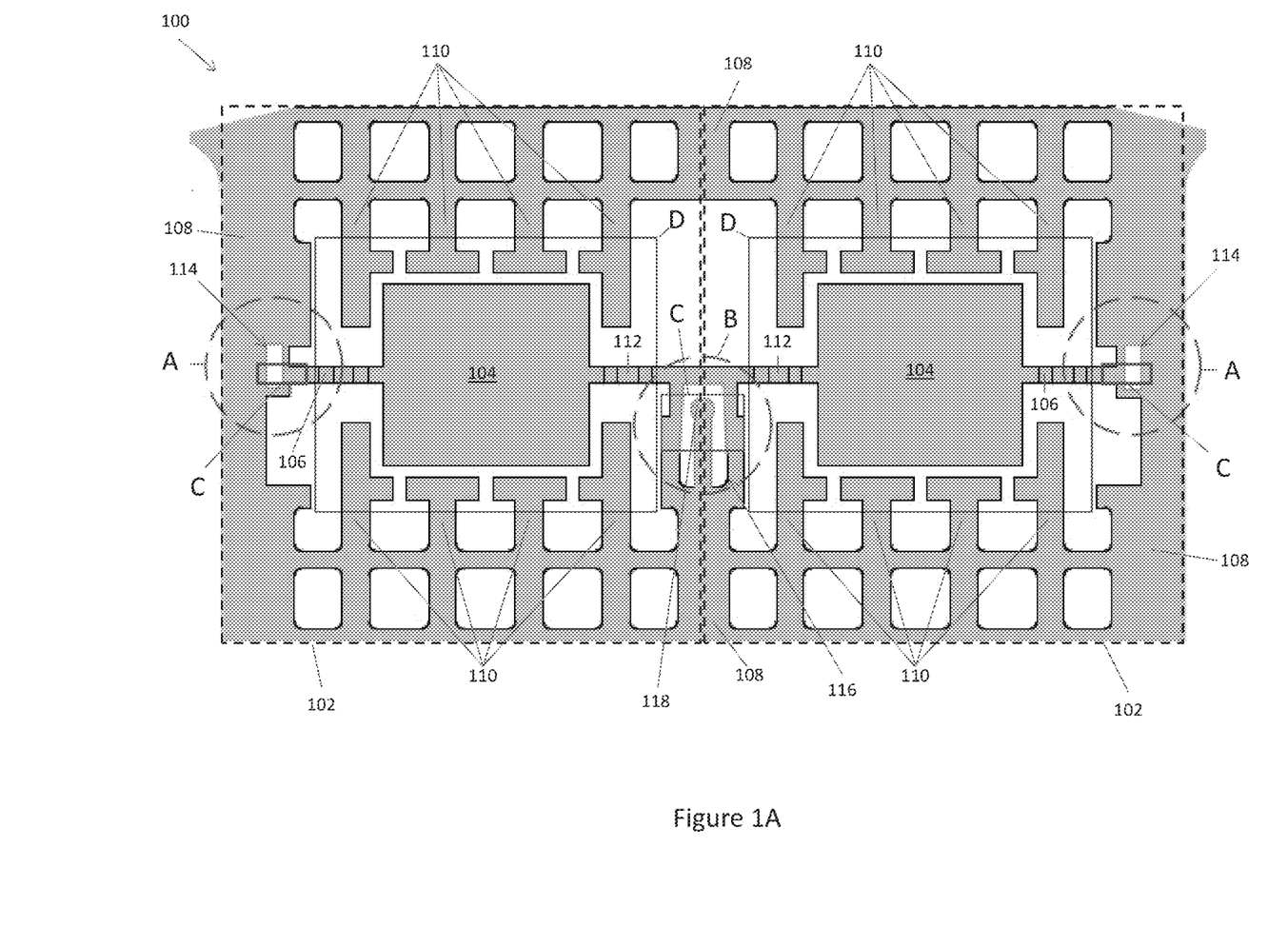
FIGS. 1A through 1C, illustrates a plan view of a lead frame strip with openings according to an embodiment.
Figure 1B:
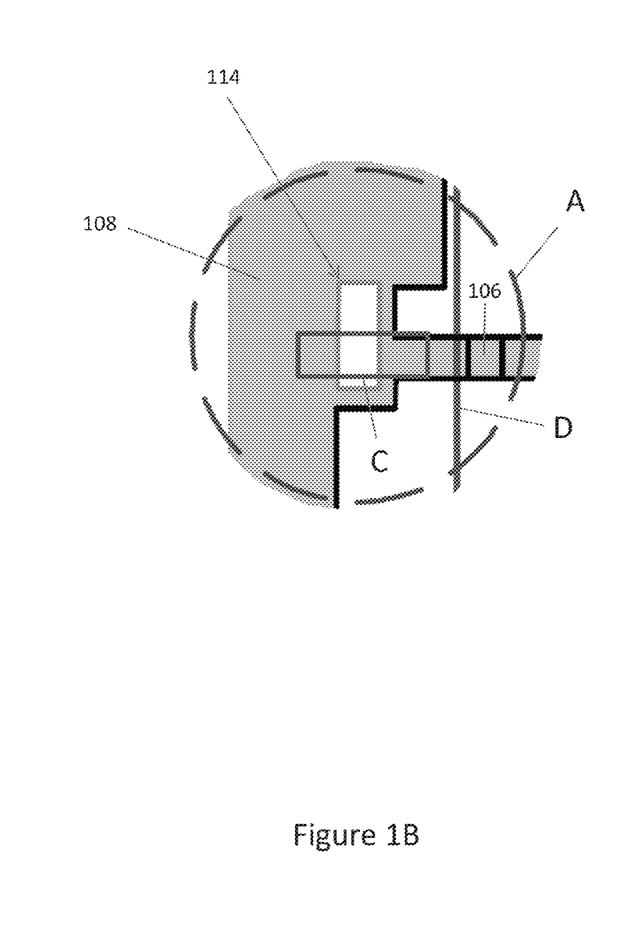
Figure 1C:
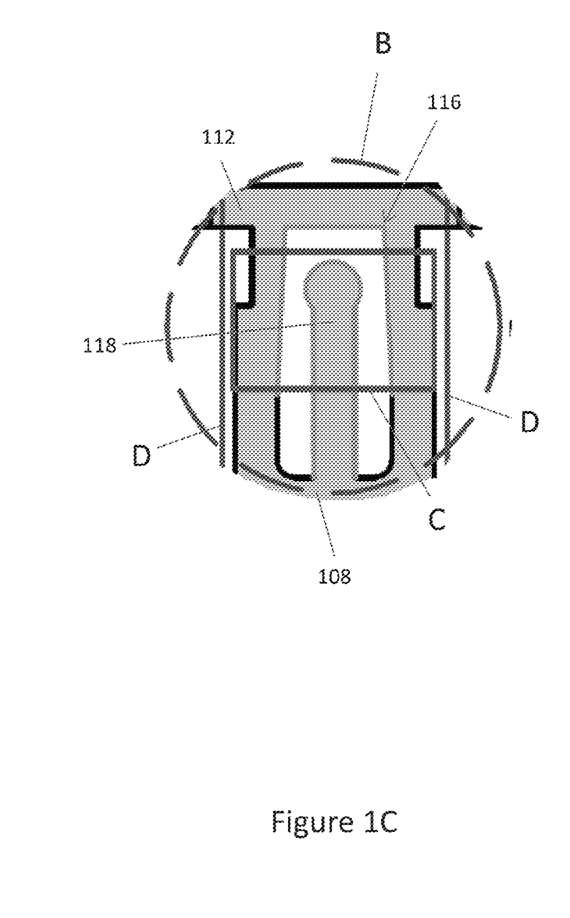

FIG. 1, which includes FIGS. 1A through 1C, illustrates a plan view of part of a lead frame strip 100 according to an embodiment. The lead frame strip 100 includes a plurality of connected unit lead frames 102, two of which are shown in FIG. 1A. FIG. 1B shows an enlarged plan view of the areas labeled 'A' in FIG. 1A, and FIG. 1C shows an enlarged plan view of the area labeled 'B' in FIG. 1A. Each unit lead frame 102 has a die paddle 104 for attaching a semiconductor die (not shown in FIG. 1), a first tie bar 106 directly connecting the die paddle 104 to the periphery 108 of the unit lead frame 102, and a plurality of leads 110 projecting from the periphery 108 toward the die paddle 104. Further according to the embodiment shown in FIG. 1, a second tie bar 112 directly connects one die paddle 104 to an adjacent die paddle 104 and to the periphery 108 of the unit lead frames 102 including the adjacent die paddles 104.

The lead frame strip 100 further includes a first opening 114 in the periphery 108 of the unit lead frames 102 adjacent the first tie bars 106, and a second opening 116 in the periphery 108 of the unit lead frames 102 adjacent the second tie bars 112. In one embodiment, the first and/or second opening 114, 116 in the periphery 108 of each unit lead frame 102 is surrounded by a closed ring of material of the lead frame strip 100 as shown in the enlarged views of FIGS. 1B and 1C. In one embodiment, a protrusion 118 extends from the periphery 108 of each unit lead frame 102 into the second opening 116 in the periphery 108 of the unit lead frame 102 as shown in the enlarged view of FIG. 1C.

In one embodiment, the lead frame strip 100 is constructed from flat sheet metal, e.g. by stamping or etching. For example, the sheet metal can be exposed to chemical etchants that remove areas not covered by photoresist. Other processing can be performed, e.g. such as laser etching to pattern the sheet metal. After the patterning process, the patterned frames are singulated (separated) into lead frame strips. One such lead frame strip 100 is shown in FIG. 1. The openings 114, 116 in the periphery 108 of the unit lead frames 102 can be patterned into the sheet metal as part of the patterning process. Alternatively, the openings 114, 116 can be formed after the patterning process, e.g. by a subsequent patterning process. In each case, the unit lead frames 102 each have one or more openings 114, 116 in the periphery 108 of the unit lead frame 102.

Prior to testing of semiconductor dies attached to the die paddles 104, partial plating, electrical charging, etc., the openings 114, 116 in the periphery 108 of the unit lead frames 102 are spanned with an electrically insulating material (not shown in FIG. 1) that connects the tie bar 106, 112 of each unit lead frame 102 to the periphery 108 of the unit lead frame 102. The regions of the unit lead frames 102 to be covered with the electrically insulating material for spanning the openings 114, 116 are labeled 'C' in FIGS. 1A through 1C. The regions of the unit lead frames 102 to be encapsulated with a molding compound to form individual packages are labeled 'D' in FIGS. 1A through 1C. More than one die paddle 104 can be included in each individual package.

Figure 2A:
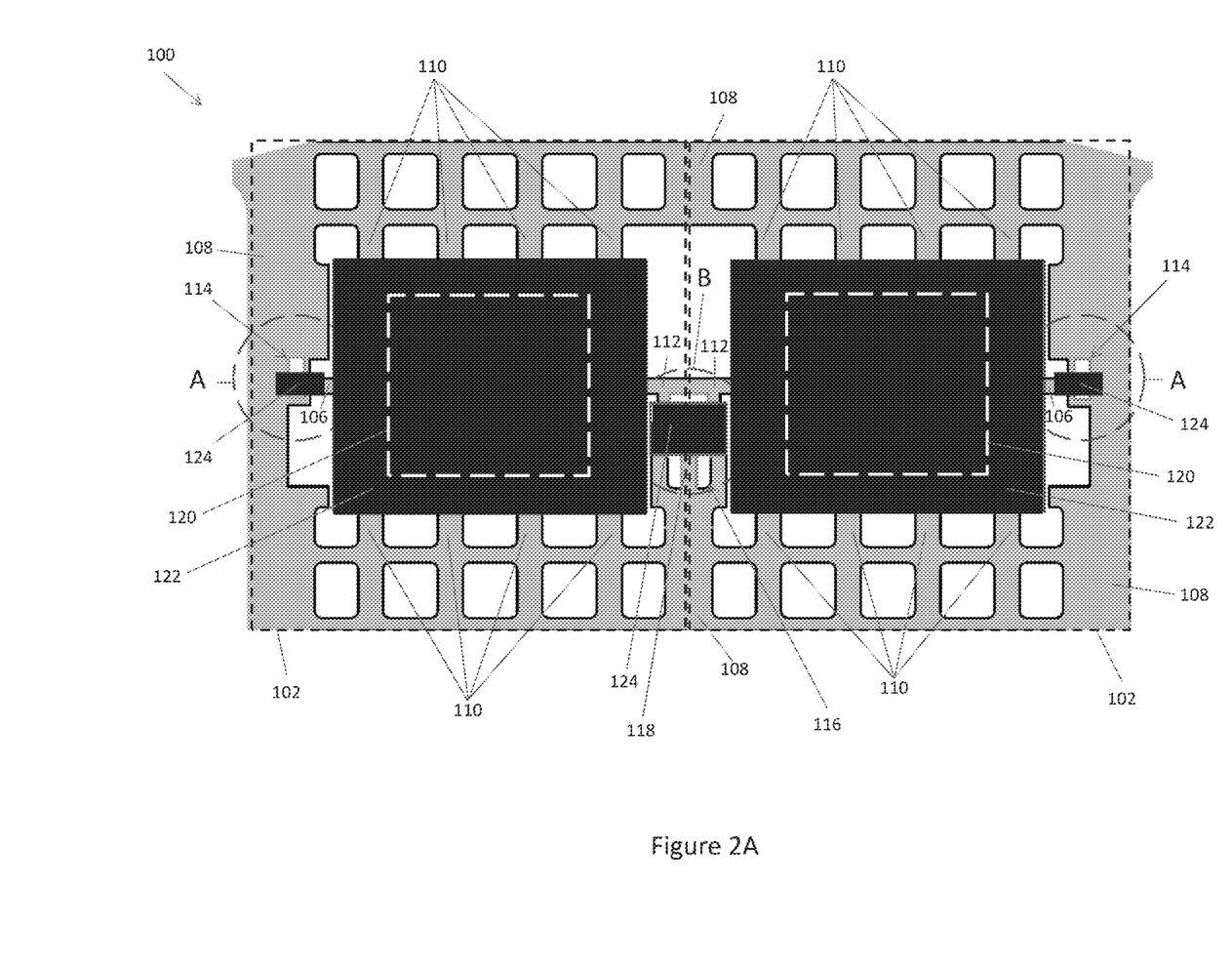
FIGS. 2A through 2C, illustrates the lead frame strip of FIG. 1 after the openings are spanned with a molding compound.
Figure 2B:
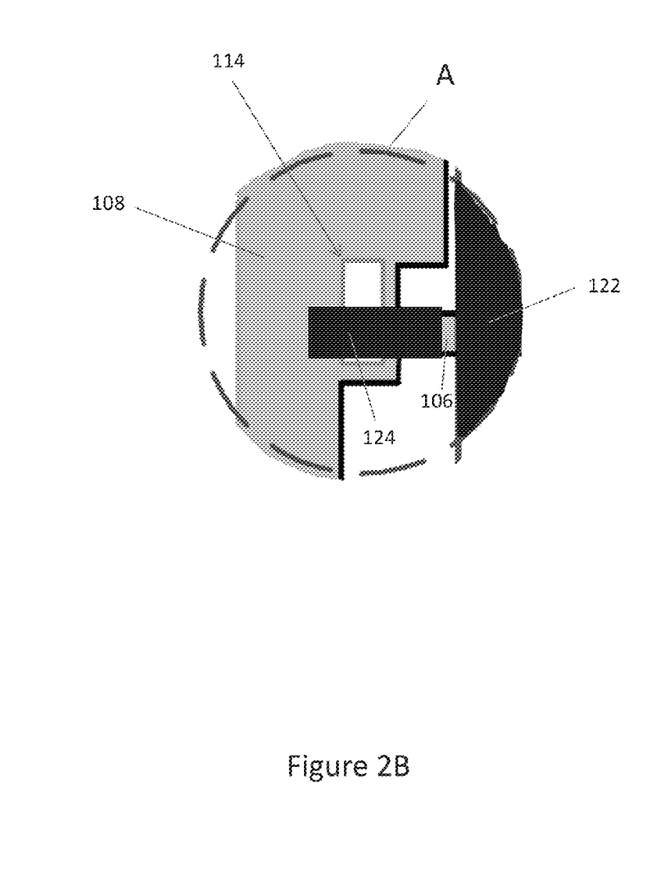
Figure 2C:
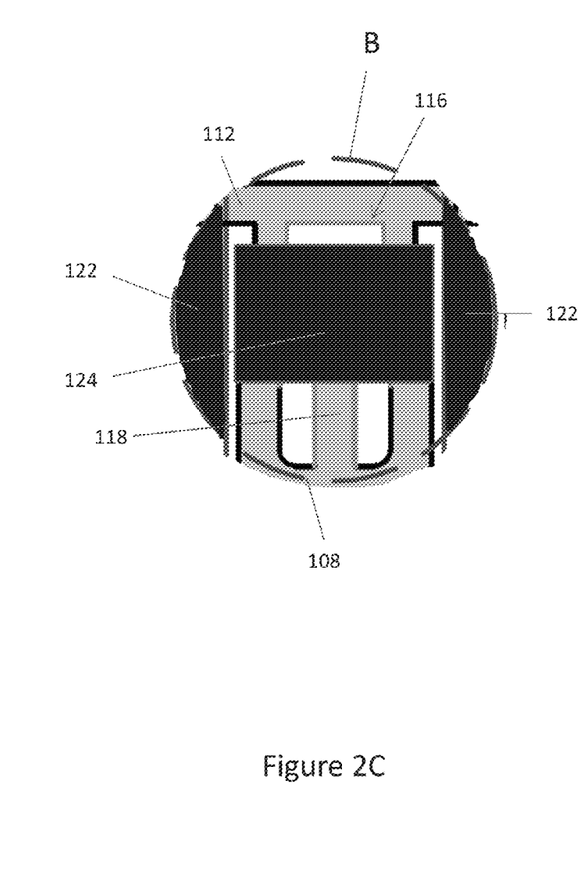

FIG. 2, which includes FIGS. 2A through 2C, illustrates the lead frame strip 100 after molding. FIG. 2A corresponds to the view of FIG. 1A after molding, FIG. 2B corresponds to the view of FIG. 1B after molding, and FIG. 2C corresponds to the view of FIG. 1C after molding. A semiconductor die 120 is attached to each of the die paddles 104 prior to molding. The semiconductor dies 120 are covered by molding compound 122, and indicated by dashed boxes in FIG. 2A. The unit lead frames 102 are also covered with molding compound 124 in the regions labeled 'D' in FIG. 1 so that part of each tie bar 106, 112 and lead 110 remains uncovered by the molding compound 122, 124.

In addition to encapsulating the semiconductor dies 120 and part of the leads 110 with molding compound 122 to form individual packages, molding compound 124 also spans the openings 114, 116 in the periphery 108 of the unit lead frames 102 i.e. in the regions labeled 'C' in FIG. 1. The molding compound 124 shown in FIG. 2B connects the first tie bar 106 of each unit lead frame 102 to the periphery 108 of the unit lead frame 102. The molding compound 124 shown in FIG. 2C connects the second tie bar 112 of each unit lead frame 102 to the periphery 108 of the unit lead frame 102.

Figure 3A:
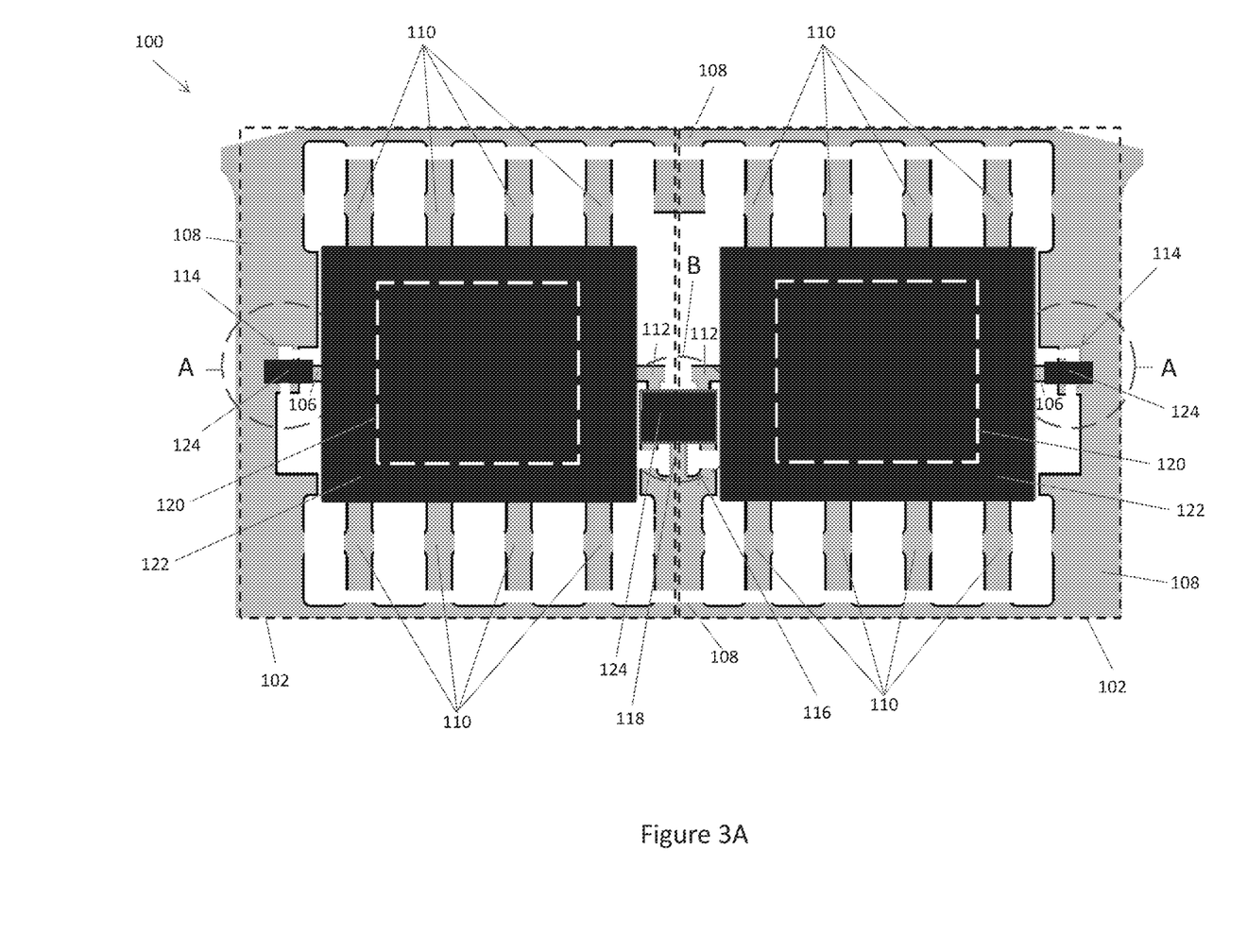
FIGS. 3A through 3C, illustrates the lead frame strip of FIG. 2 after the tie bars are severed and prior to separation of the individual packages.
Figure 3B:
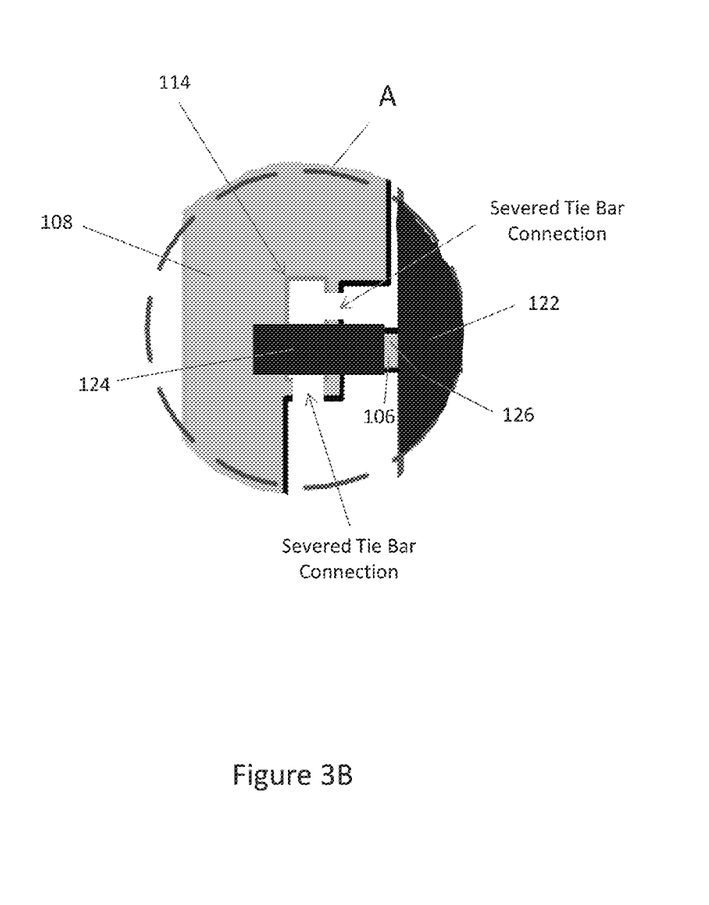
Figure 3C:
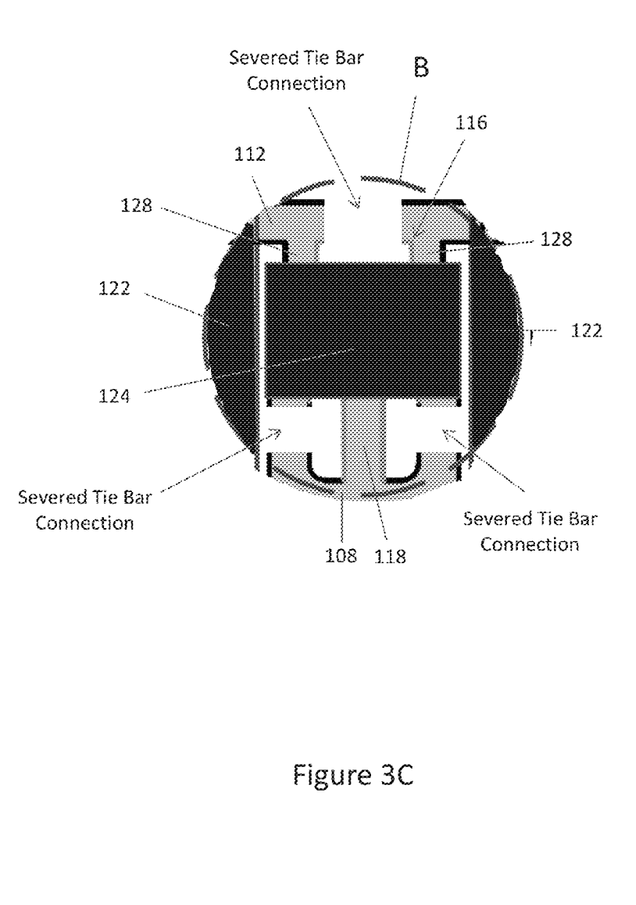

FIG. 3, which includes FIGS. 3A through 3C, illustrates the lead frame strip 100 of FIG. 2 after severing of the tie bars 106, 112 and leads 110 from the periphery 108 of the unit lead frames 102. FIG. 3A corresponds to the view of FIG. 2A after the severing process, FIG. 3B corresponds to the view of FIG. 2B after the severing process, and FIG. 3C corresponds to the view of FIG. 2C after the severing process. The direct connection between the tie bars 106, 112 and the periphery 108 of the unit lead frames 102, and between the leads 110 and the periphery 108 of the unit lead frames 102, can be severed by any standing severing process such as cutting, chemical or laser etching, etc. In the case of the openings 114, 116 in the periphery 108 of each unit lead frame 102 being surrounded by a closed ring of material of the lead frame strip 100, the closed ring is opened along at least one part of the ring by severing the direct connection between the tie bars 106, 112 and the periphery 108 of the unit lead frames 102 as shown in the enlarged views of FIGS. 3B and 3C.

After severing the direct connection between the tie bars 106, 112 and the periphery 108 of the unit lead frames 102, the tie bars 106, 112 remain connected to the periphery 108 of the unit lead frames 102 by the molding compound 124 formed in regions 'C' of FIG. 1. The die paddles 104 are electrically disconnected from the periphery 108 of the unit lead frames 102 after the direct connection is severed between the tie bars 106, 112 and the periphery 108 of the unit lead frames 102. The molding compound 124 which spans the openings 114, 116 in the periphery 108 of the unit lead frames 102 provides adequate support to the die paddles 104 during subsequent lead frame strip testing, partial plating, electrical charging, etc. The semiconductor dies 120 can be tested using any standard lead frame strip testing process, after the tie bars 106, 112 and leads 110 are severed from the periphery 108 of the unit lead frames 102. The unit lead frames 102 can be separated after testing the semiconductor dies 120, partial plating, electrical charging, etc.

In one embodiment, the unit lead frames 102 are separated after strip testing of the semiconductor dies 120, partial plating, electrical charging, etc., by severing the first tie bars 106 in a region 126 between the molding compound 124 covering the first tie bars 106 and the molding compound 122 encapsulating the semiconductor dies 120. The second tie bars 112 are similarly severed in a region 128 between the molding compound 124 covering the second tie bars 112 and the molding compound 122 encapsulating the semiconductor dies 120.

Figure 4A:
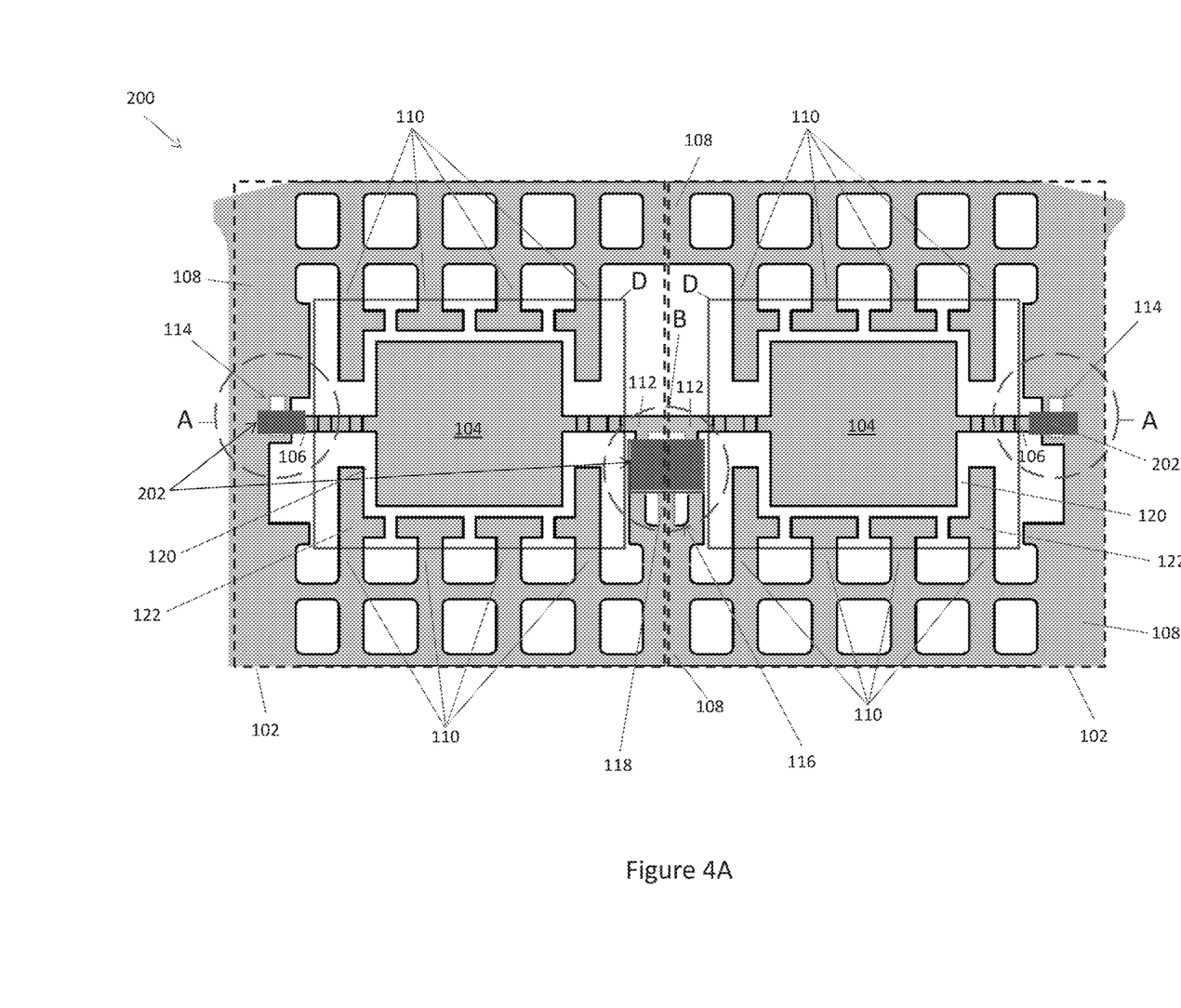
FIGS. 4A through 4C, illustrates a top-down plan view of an embodiment of a lead frame strip with openings spanned with an electrically insulating adhesive tape or glue.
Figure 4B:
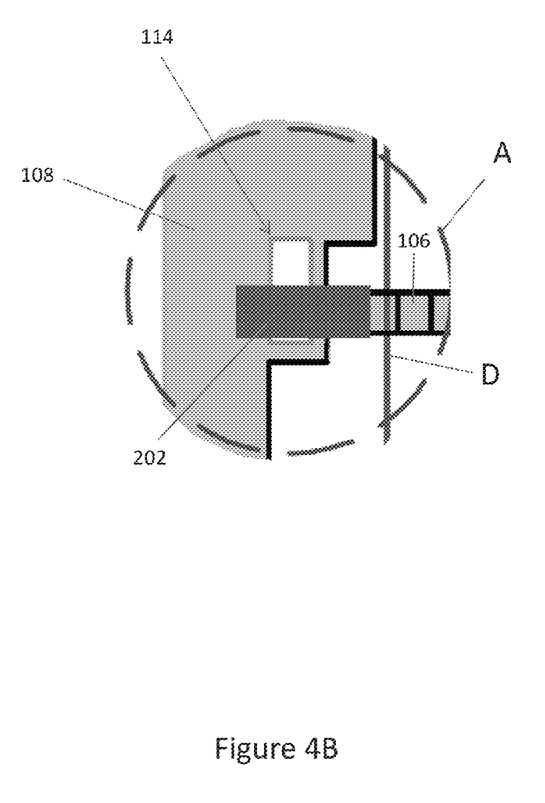
Figure 4C:
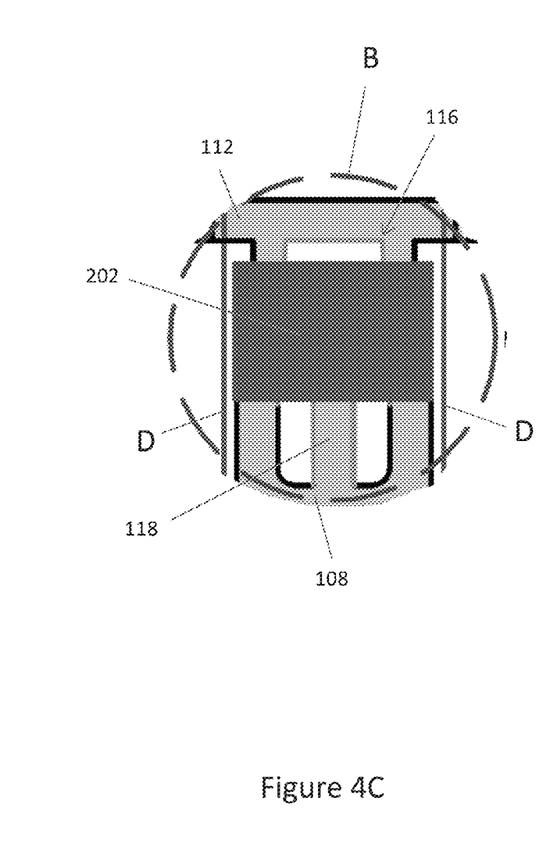

FIG. 4, which includes FIGS. 4A through 4C, illustrates a plan view of part of a lead frame strip 200 according to another embodiment. The lead frame strip 200 includes a plurality of connected unit lead frames 102, two of which are shown in FIG. 4A. FIG. 4B shows an enlarged plan view of the area labeled 'A' in FIG. 4A, and FIG. 4C shows an enlarged plan view of the area labeled 'B' in FIG. 4A. The embodiment shown in FIG. 4 is similar to the one shown in FIG. 1, however, the electrically insulating material spanning the openings 114, 116 in the periphery 108 of the unit lead frames 102 is an adhesive tape or adhesive glue 202 instead of molding compound. The adhesive tape or adhesive glue 202 can be applied during manufacturing of the lead frame strip 200 or later e.g. as part of the die attach process. In each case, the openings 114, 116 formed in the periphery 108 of the lead frame units 102 are spanned with an electrically insulating material 202 that connects each tie bar 106, 112 to the periphery 108 of the corresponding unit lead frame 102. The openings 114, 116 in the periphery 108 of the unit lead frames 102 are designed such that the direct connection between the tie bars 106, 112 and the periphery 108 of the unit lead frames 102 can be severed so that the severed tie bars 106, 112 remain connected to the periphery 108 of the unit lead frames 102 by the electrically insulating material 202. This way, the die paddles 104 can be electrically disconnected from the periphery 108 of the unit lead frames 102 during lead frame strip testing, partial plating, electrical charging, etc., but still have sufficient mechanical support.

Figure 5A:
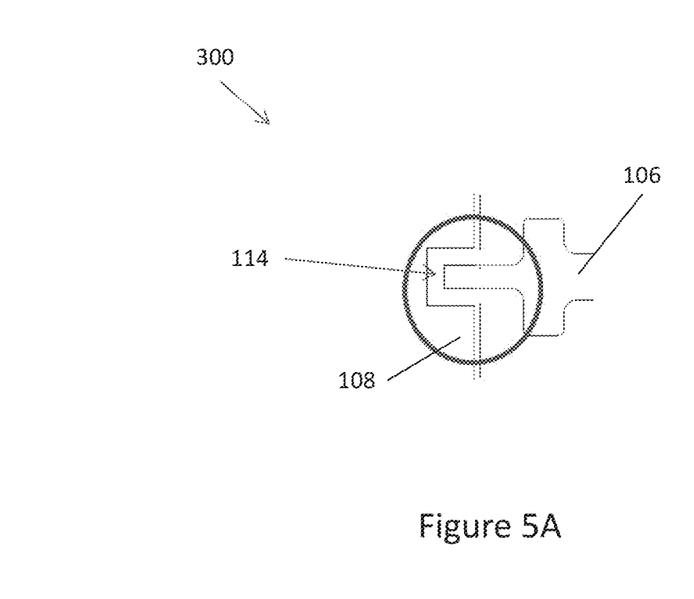
FIGS. 5A and 5B, illustrates a top-down partial plan view of another embodiment of a lead frame strip with openings spanned with an electrically insulating adhesive tape or glue.
Figure 5B:
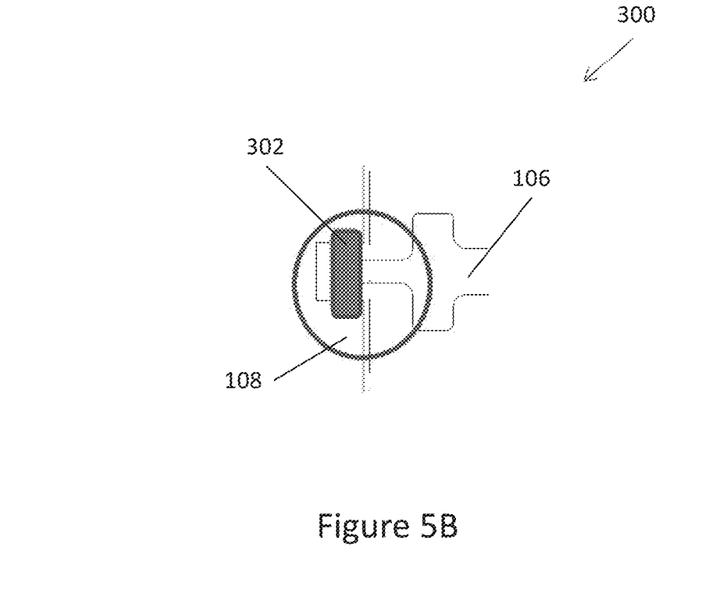

FIG. 5, which includes FIGS. 5A and 5B, illustrates a plan view of part of a lead frame strip 300 according to another embodiment. FIG. 5A shows part of the periphery 108 of the lead frame strip 300 with a tie bar 106 extending toward the periphery 108. The tie bar 106 is completely separated from the periphery 108 by an opening 114 in the lead frame strip 300. FIG. 5B shows the same part of the periphery 108 of the lead frame strip 300 in FIG. 5A, with the opening 114 formed in the periphery 108 of the lead frame strip 300 spanned with an electrically insulating material 302 such as an adhesive tape or glue that connects the tie bar 106 to the periphery 108. According to this embodiment, there is no electrical connection between tie bar 106 and the lead frame periphery 108, thus additional cutting and securing of the die paddle is not necessary.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a lead frame strip including a plurality of connected unit lead frames, each unit lead frame having a die paddle, a tie bar directly connecting the die paddle to a periphery of the unit lead frame, a plurality of leads directly connected to the periphery of the unit lead frame and projecting toward the die paddle, and an opening in the periphery adjacent the tie bar, the method comprising:
    attaching a semiconductor die to each of the die paddles;
    spanning the openings in the periphery of the unit lead frames with an electrically insulating material that connects the tie bar of each unit lead frame to the periphery of the unit lead frame;
    covering the unit lead frames with a molding compound so that part of each tie bar and lead remains uncovered by the molding compound;
    severing the direct connection between the leads and the periphery of the unit lead frames and the direct connection between the tie bars and the periphery of the unit lead frames, so that the tie bars remain connected to the periphery of the unit lead frames by the electrically insulating material and the die paddles are electrically disconnected from the periphery of the unit lead frames; and
    processing the lead frame strip after the severing of the direct connections.

2. The method of claim 1, wherein spanning the openings in the periphery of the unit lead frames with the electrically insulating material comprises covering at least part of the openings in the periphery of the unit lead frames with a molding compound that connects the tie bar of each unit lead frame to the periphery of the unit lead frame.

3. The method of claim 1, wherein spanning the openings in the periphery of the unit lead frames with the electrically insulating material comprises covering at least part of the openings in the periphery of the unit lead frames with at least one of an adhesive tape and an adhesive glue that connects the tie bar of each unit lead frame to the periphery of the unit lead frame.

4. The method of claim 1, wherein the lead frame strip further includes an additional tie bar directly connecting adjacent ones of the die paddles to one another and to the periphery of the unit lead frames including the adjacent die paddles, and an additional opening in the periphery of the unit lead frames adjacent each additional tie bar, the method further comprising:
    spanning the additional openings in the periphery of the unit lead frames with an electrically insulating material that connects the additional tie bar of each unit lead frame to the periphery of the unit lead frame; and severing the direct connection between the additional tie bars and the periphery of the unit lead frames so that the additional tie bars remain connected to the periphery of the unit lead frames by the electrically insulating material and the adjacent die paddles are electrically disconnected from one another.

5. The method of claim 4, wherein spanning the additional openings in the periphery of the unit lead frames with the electrically insulating material comprises covering at least part of the additional openings in the periphery of the unit lead frames with a molding compound that connects the additional tie bar of each unit lead frame to the periphery of the unit lead frame.

6. The method of claim 4, wherein spanning the additional openings in the periphery of the unit lead frames with the electrically insulating material comprises covering at least part of the additional openings in the periphery of the unit lead frames with at least one of an adhesive tape and an adhesive glue that connects the additional tie bar of each unit lead frame to the periphery of the unit lead frame.

7. The method of claim 4, further comprising:
severing the tie bars between the electrically insulating material covering the tie bars and the molding compound covering the unit lead frames after the severing of the direct connections; and
severing the additional tie bars between the electrically insulating material covering the additional tie bars and the molding compound covering the unit lead frames after the severing of the direct connections.

8. The method of claim 1, wherein the opening in the periphery of each unit lead frame is surrounded by a closed ring of material of the lead frame strip, and wherein the closed ring is opened along at least one part of the ring by severing the direct connection between the tie bars and the periphery of the unit lead frames.

9. A method of processing a lead frame strip including a plurality of connected unit lead frames, each unit lead frame having a die paddle, a tie bar directly connecting the die paddle to a periphery of a unit lead frame, and a plurality of leads directly connected to the periphery of the unit lead frame and projecting toward the die paddle, the method comprising:
forming an opening in the periphery of each unit lead frame adjacent the tie bar of the unit lead frame;
attaching a semiconductor die to each of the die paddles;
spanning the openings in the periphery of the unit lead frames with an electrically insulating material that connects the tie bar of each unit lead frame to the periphery of the unit lead frame;
covering the unit lead frames with a molding compound so that part of each tie bar and lead remains uncovered by the molding compound;
severing the direct connection between the leads and the periphery of the unit lead frames and the direct connection between the tie bars and the periphery of the unit lead frames, so that the tie bars remain connected to the periphery of the unit lead frames by the electrically insulating material and the die paddles are electrically disconnected from the periphery of the unit lead frames; and processing the lead frame strip after the severing of the direct connections.

10. The method of claim 9, wherein spanning the openings in the periphery of the unit lead frames with the electrically insulating material comprises covering at least part of the openings in the periphery of the unit lead frames with a molding compound that connects the tie bar of each unit lead frame to the periphery of the unit lead frame.

11. The method of claim 9, wherein spanning the openings in the periphery of the unit lead frames with the electrically insulating material comprises covering at least part of the openings in the periphery of the unit lead frames with at least one of an adhesive tape and an adhesive glue that connects the tie bar of each unit lead frame to the periphery of the unit lead frame.

12. The method of claim 9, wherein the lead frame strip further includes an additional tie bar directly connecting adjacent ones of the die paddles to one another and to the periphery of the unit lead frames including the adjacent die paddles, and an additional opening in the periphery of the unit lead frames adjacent each additional tie bar, the method further comprising:
spanning the additional openings in the periphery of the unit lead frames with an electrically insulating material that connects the additional tie bar of each unit lead frame to the periphery of the unit lead frame; and
severing the direct connection between the additional tie bars and the periphery of the unit lead frames so that the additional tie bars remain connected to the periphery of the unit lead frames by the electrically insulating material and the adjacent die paddles are electrically disconnected from one another.

13. The method of claim 12, wherein spanning the additional openings in the periphery of the unit lead frames with the electrically insulating material comprises covering at least part of the additional openings in the periphery of the unit lead frames with a molding compound that connects the additional tie bar of each unit lead frame to the periphery of the unit lead frame.

14. The method of claim 12, wherein spanning the additional openings in the periphery of the unit lead frames with the electrically insulating material comprises covering at least part of the additional openings in the periphery of the unit lead frames with at least one of an adhesive tape and an adhesive glue that connects the additional tie bar of each unit lead frame to the periphery of the unit lead frame.

15. The method of claim 12, further comprising:
severing the tie bars between the electrically insulating material covering the tie bars and the molding compound covering the unit lead frames after the severing of the direct connections; and
severing the additional tie bars between the electrically insulating material covering the additional tie bars and the molding compound covering the unit lead frames after the severing of the direct connections.

16. The method of claim 9, wherein the opening in the periphery of each unit lead frame is surrounded by a closed ring of material of the lead frame strip, and wherein the closed ring is opened along at least one part of the ring by severing the direct connection between the tie bars and the periphery of the unit lead frames.

* * * * *